US006816526B2

(12) United States Patent
Biard et al.

(10) Patent No.: US 6,816,526 B2
(45) Date of Patent: Nov. 9, 2004

(54) GAIN GUIDE IMPLANT IN OXIDE VERTICAL CAVITY SURFACE EMITTING LASER

(75) Inventors: James R. Biard, Richardson, TX (US); James K. Guenter, Garland, TX (US)

(73) Assignee: Finisar Corporation, Sunnyvale, CA (US)

( * ) Notice: Subject to any disclaimer, the term of this patent is extended or adjusted under 35 U.S.C. 154(b) by 248 days.

(21) Appl. No.: 10/028,436

(22) Filed: Dec. 28, 2001

(65) Prior Publication Data

US 2003/0123502 A1 Jul. 3, 2003

(51) Int. Cl.[7] .................................................. H01S 3/19

(52) U.S. Cl. ............................ 372/46; 372/43; 372/49; 372/45

(58) Field of Search ............................. 372/46, 45, 44, 372/42, 43

(56) References Cited

U.S. PATENT DOCUMENTS

| | | | | |
|---|---|---|---|---|
| 5,056,098 A | * | 10/1991 | Anthony et al. | ............... 372/45 |
| 5,245,622 A | * | 9/1993 | Jewell et al. | ................... 372/45 |
| 5,328,854 A | * | 7/1994 | Vakhshoori et al. | ........... 438/22 |
| 5,574,738 A | * | 11/1996 | Morgan | ......................... 372/28 |
| 6,064,683 A | | 5/2000 | Johnson | |
| 6,256,331 B1 | | 7/2001 | Kitoh et al. | |
| 2003/0042501 A1 | * | 3/2003 | Greenwald et al. | .......... 257/189 |

OTHER PUBLICATIONS

Notification of Transmittal of the International Search Report or the Declaration, dated Jan. 14, 2004, relative to PCT. Application No. PCT/US02/39513, the foreign equivalent to the instant U.S. application 10/028,436.

Chang C–H et al. Parasitics and Design Considerations on Oxide–Implant VCSELS: IEEE Photonics Technology Letters, IEEE Inc. New York, US vol. 13, No. 12, Dec. 2001, pp. 1274–1276, XP001076755 ISSN: 1041–1135.

Young E W et al.: :Single–Transverse–Mode Vertical–Cavity Lasers Under Continous and Pulsed Operation IEEE Photonics Technology Letters, Sep. 2001, IEEE, USA, vol. 13, No. 9, pp. 927–929, XP002265855 ISSN: 1041–1135.

K.D. Choquette, et al., "Low Threshold Voltage Vertical–Cavity Lasers Fabricated by Selective Oxidation", *Electronics Letters*, Nov. 24, 1994, vol. 30, No. 24, ppgs. 2043–2044.

Y. H. Lee et al., "Top–Surface–Emitting GaAs Four–Quantum–Well Lasers Emitting at 0.85µm", *Electronics Letters*, May 24, 1990, vol. 26, No. 11, ppgs. 710–711.

D.L. Huffaker, et al., "Native–oxide Defined Ring Contact for Low Threshold Vertical–Cavity Lasers", *Applied Physics Letters*, Jul. 4, 1994, vol. 65, No. 1, ppgs. 97–99.

C.H. Chang, et al., "Parasitics and Design Considerations on Oxide–Implant VCSELs", *IEEE Photonics Technology Letters*, Dec. 2001, vol. 13, No. 12, ppgs. 1274–1276.

(List continued on next page.)

*Primary Examiner*—Haissa Philogene
*Assistant Examiner*—Dung T Nguyen
(74) *Attorney, Agent, or Firm*—Workman Nydegger

(57) ABSTRACT

A vertical cavity surface emitting laser with a current guide comprised of an ion implant region and an oxide structure. The oxide structure is beneficially formed first, then, a gain guide ion implant region is formed in or below the oxide structure. The ion implant region extends into an active region. The energy and dosage used when forming the ion implant gain guide can be selected to control the lateral sheet resistance and the active region's non-radiative recombination centers.

25 Claims, 2 Drawing Sheets

OTHER PUBLICATIONS

T.E. Sale, "Vertical Cavity Surface Emitting Lasers," Research Press Ltd., ppgs. 117–127, (1995).

A.J. Fischer, et al., "5.2 mW Single–Mode Power from a Coupled Resonator Vertical–Cavity Laser", LEOS 2000 Proceedings, ppgs. 802–803.

G. Ronald Hadley, et al., "High–Power Single Mode Operation of Hybrid Ion–Implanted/Selectively–Oxidized VCSELs", ppgs. 804–805.

K.D. Choquette et al., "High Single Mode Operation from Hybrid Ion Implanted/Selectively Oxidized VCSELs," IEE International Semiconductor Laser Conference 2000, Albuquerque, N.M., Conference Digest, ppgs. 59–60.

K.D. Choquette et al., "Single Transverse Mode Selectively Oxidized Vertical Cavity Lasers," Proceedings of the SPIE, vol. 3946 (2000), ppgs. 230–233.

* cited by examiner

GAIN GUIDE IMPLANT IN OXIDE VERTICAL CAVITY SURFACE EMITTING LASER

CROSS-REFERENCE TO RELATED APPLICATIONS

Not applicable.

BACKGROUND OF THE INVENTION

1. Field of the Invention

This invention relates to vertical cavity surface emitting lasers (VCSELs). More specifically, it relates to VCSEL current confinement structures.

2. Discussion of the Related Art

VCSELs represent a relatively new class of semiconductor lasers. While there are many variations of VCSELs, one common characteristic is that they emit light perpendicular to a wafer's surface. Advantageously, VCSELs can be formed from a wide range of material systems to produce specific characteristics.

VCSELs include semiconductor active regions, which can be fabricated from a wide range of material systems, distributed Bragg reflector (DBR) mirrors, current confinement structures, substrates, and contacts. Because of their complicated structure, and because of their material requirements, VCSELs are usually grown using metal-organic chemical vapor deposition (MOCVD) or molecular beam epitaxy (MBE).

FIG. 1 illustrates a typical VCSEL 10. As shown, an n-doped gallium arsenide (GaAS) substrate 12 has an n-type electrical contact 14. An n-doped lower mirror stack 16 (a DBR) is on the GaAS substrate 12, and an n-type lower spacer 18 is disposed over the lower mirror stack 16. An active region 20, usually having a number of quantum wells, is formed over the lower spacer 18. A p-type top spacer 22 is disposed over the active region 20, and a p-type top mirror stack 24 (another DBR) is disposed over the top spacer 22. Over the top mirror stack 24 is a p-type conduction layer 9, a p-type GaAs cap layer 8, and a p-type electrical contact 26.

Still referring to FIG. 1, the lower spacer 18 and the top spacer 22 separate the lower mirror stack 16 from the top mirror stack 24 such that an optical cavity is formed. As the optical cavity is resonant at specific wavelengths, the mirror separation is controlled such that resonance occurs at a predetermined wavelength (or at a multiple thereof). At least part of the top mirror stack 24 includes an insulating region 40 that provides for current confinement. The insulating region 40 is usually formed either by implanting protons into the top mirror stack 24 or by forming an oxide layer. In either case, the insulating region 40 defines a conductive annular central opening 42. Thus, the central opening 42 forms an electrically conductive path though the insulating region 40.

In operation, an external bias causes an electrical current 21 to flow from the p-type electrical contact 26 toward the n-type electrical contact 14. The insulating region 40 and the conductive central opening 42 confine that current such that it flows through the conductive central opening 42 to the active region 20. Some of the electrons that form the current 21 are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 1, the light 23 passes through the p-type conduction layer 9, through the p-type GaAs cap layer 8, through an aperture 30 in the p-type electrical contact 26, and out of the surface of the vertical cavity surface emitting laser 10.

It should be understood that FIG. 1 illustrates a typical VCSEL, and that numerous variations are possible. For example, the dopings can be changed (say, by providing a p-type substrate 12), different material systems can be used, operational details can be tuned for maximum performance, and additional structures, such as tunnel junctions, can be added.

While generally successful, VCSELs have problems. For example, to some extent the insulating region 40 is less than optimal. As previously noted the insulating region 40 and the central opening 42 form a current confinement region that guides current into the active region. Also as noted, the insulating region is usually produced either by implanting protons or by forming an oxide layer. Proton implantation is described by Y. H. Lee et al., Electron Letters, Vol. 26, No. 11, pp. 710–711 (1990) and by T. E. Sale, "Vertical Cavity Surface Emitting Lasers," Research Press Ltd., pp. 117–127 (1995), both of which are incorporated by reference. Oxide layers are taught by D. L. Huffaker et al., Applied Physics Letters, Vol. 65, No. 1, pp. 97–99 (1994) and by K. D. Choquette et al., Electron Letters, Vol. 30, No.24, pp. 2043–2044 (1994), both of which are incorporated by reference.

Ion-implanted VCSELs are typically formed by a single energy proton implant in the form of an annular ring. Proton implantation creates structural defects that produce a relatively high resistance structure having an annular conductive region. This implanted region, or gain guide, is disposed such that the peak concentration of defects lies above the active region 20, but below the conduction region 9. The defect density does not drop to zero immediately above and below the implantation peak, rather it gradually drops from the peak value, so that a very small, but finite number of these defects occur even in the active region 20. While the relatively high resistance structure effectively steers current through the annular conductive region and into the active region, ion implantation does not produce significant optical guiding. Thus, ion implantation does not strongly impact the optical modes of the VCSEL. However, ion implantation defects can form non-radiative recombination centers in an active layer's P-N junction quantum wells. Such non-radiative recombination centers can cause the junction area under the implant to not emit light. Furthermore, the P-N junction under the implant has a lower forward voltage at constant current density than the P-N junction at the center of the cavity. In conjunction with the distributed nature of the series resistance of the P-N junction, the ion implanted non-radiative recombination centers cause the P-N junction current density to be highest in the center of the cavity. Until and unless other effects become large enough to counter this behavior, this makes the optical gain highest in the center of the cavity, which discourages the formation of higher order optical modes.

In contrast, VCSELs that use oxide current confinement regions can be made relatively small, which decreases threshold and operating currents. Additionally, since an oxide current confinement region has an optical index of refraction that is about half that of the region before oxidation, an oxide current confinement region forms a refractive optical index guide, which leads to transverse mode confinement, and which can further reduce operating current. The electrical properties of oxide current confinement VCSELs are very desirable. They can have higher bandwidths and lower lasing current thresholds (when compared to ion-implanted VCSELs). However, oxidation does not introduce non-radiative centers in the PN junction. Because of the distributed nature of the series resistance, oxide VCSELs have the highest P-N junction current density and the highest optical gain at the edge of the cavity. This current distribution tends to encourage the formation of higher order optical modes, particularly at large bias currents.

Oxide VCSELs (those that use oxide current confinement) typically include an AlGaAs layer having a high aluminum content (over 95%, and typically in the range of 97–98%) that is used to form the current confinement region. Such a high aluminum content structure tends to oxidize much more rapidly than the material layers used to form a P-type DBR mirror (which in this case might be 90% Al and 10% Ga). To fabricate the oxide current confinement, reactive ion etching is used to form trenches to the edge of the high Al content layer. Oxidation then typically proceeds to form a 10-micron deep oxide layer in the high Al content layer, while forming less then a 1 micron deep oxide layer in the mirror layers. Beneficially, the high Al content layer oxidizes with a complex aluminum oxide that is not only an electrical insulator, but also occupies about the same space as the layer before oxidation.

Both oxide VCSELs and ion-implanted VCSELs may have an additional ion-implantation structure disposed at a larger diameter than either the oxide aperture or the gain guide aperture, respectively. This implantation, if present, provides a continuous high resistance zone extending the entire distance from the p-type electrical contact 26 to the lower spacer 18. The function of this large-diameter implantation is to electrically isolate each device from its neighbors; it does not substantially affect the performance differences between the two described VCSEL types.

Because oxide VCSELs and ion-implanted VCSELs have different characteristics, VCSEL designers have had to select from among competing features, high output with higher order optical modes (oxide VCSELs), or lower output but with fewer optical modes (ion implanted VCSEL). Therefore, a new technique of forming VCSELs with the benefits of both ion implanted VCSELs and oxide VCSELs would be beneficial.

SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

Accordingly, the principles of the present invention are directed to a new VCSEL that has benefits of both ion implanted VCSELs and oxide VCSELs. According to the principles of the present invention, an oxide VCSEL is formed. Then, a gain guide ion implant region is formed substantially below the oxide region. The combination of the oxide layer and the ion implant gain guide makes it possible to achieve desirable low order optical modes with a low current threshold and at a high efficiency. The ion implant gain guide and the oxide layer do not have to have the same aperture diameters. Furthermore, the ion implant is beneficially performed such that the ion implant extends beneath the oxide. This enables non-radiative currents to exist in the outermost portions of the active region and further increases the lateral resistance of the material between the oxide layer and the active region. The energy and dosage used when forming the ion implant gain guide can be tailored to independently control the lateral sheet resistance and the quantum well recombination centers.

Additional features and advantages of the invention will be set forth in the description that follows, and in part will be apparent from that description, or may be learned by practice of the invention. The objectives and other advantages of the invention will be realized and attained by the structure particularly pointed out in the written description and claims hereof as well as the appended drawings.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the spirit and scope of the invention will become apparent to those of skill in the art from the detailed description of the invention and claims that follow.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

In the drawings.

Figure 1:
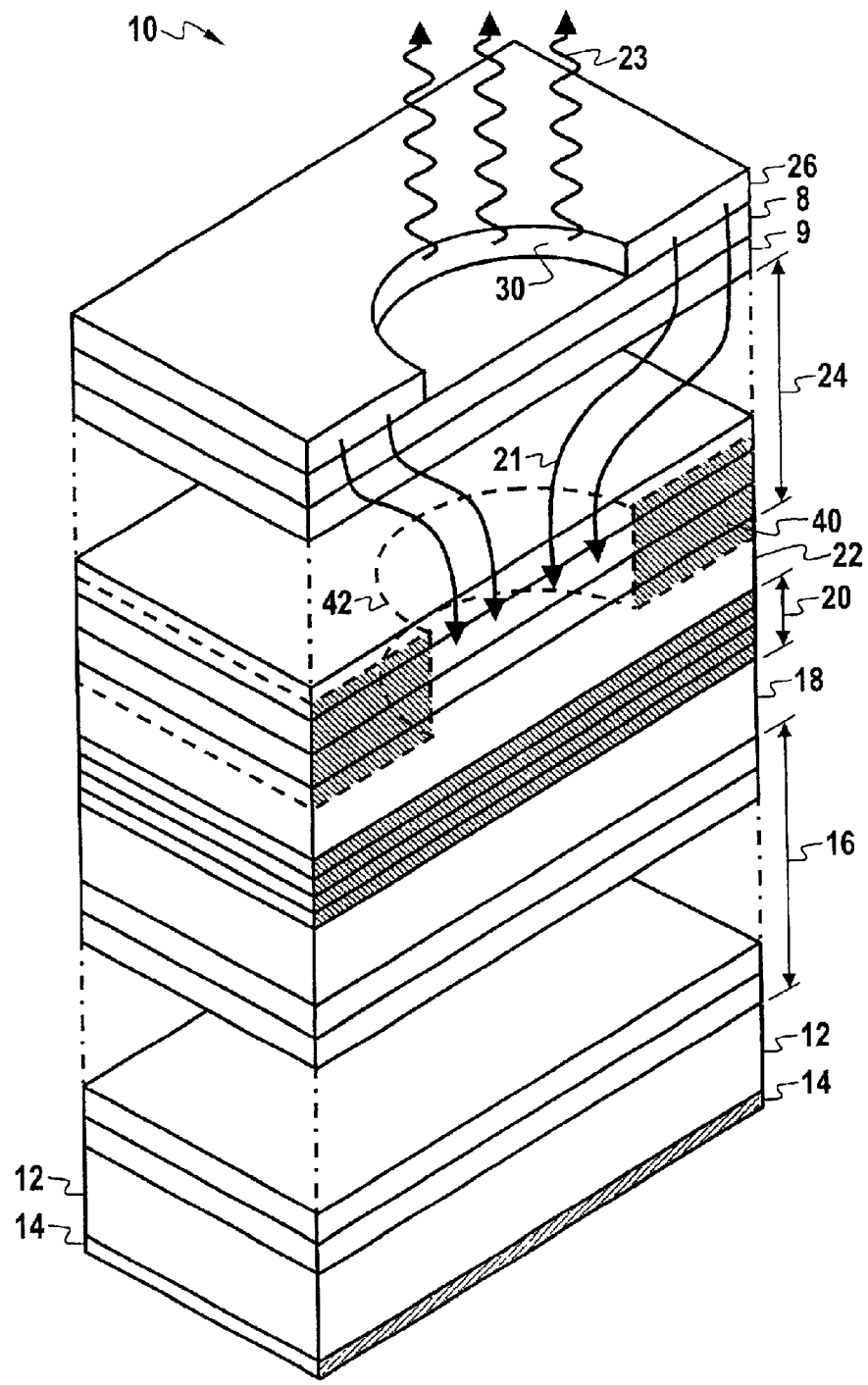
FIG. 1 illustrates a typical vertical cavity surface emitting laser.

Note that in the drawings that like numbers designate like elements. Additionally, for explanatory convenience the descriptions use directional signals such as up and down, top and bottom, and lower and upper. Such signals, which are derived from the relative positions of the elements illustrated in the drawings, are meant to aid the understanding of the present invention, not to limit it.

DETAILED DESCRIPTION OF THE ILLUSTRATED EMBODIMENTS

Reference will now be made in detail to an embodiment of the present invention, example of which is illustrated in the accompanying drawings.

Figure 2:
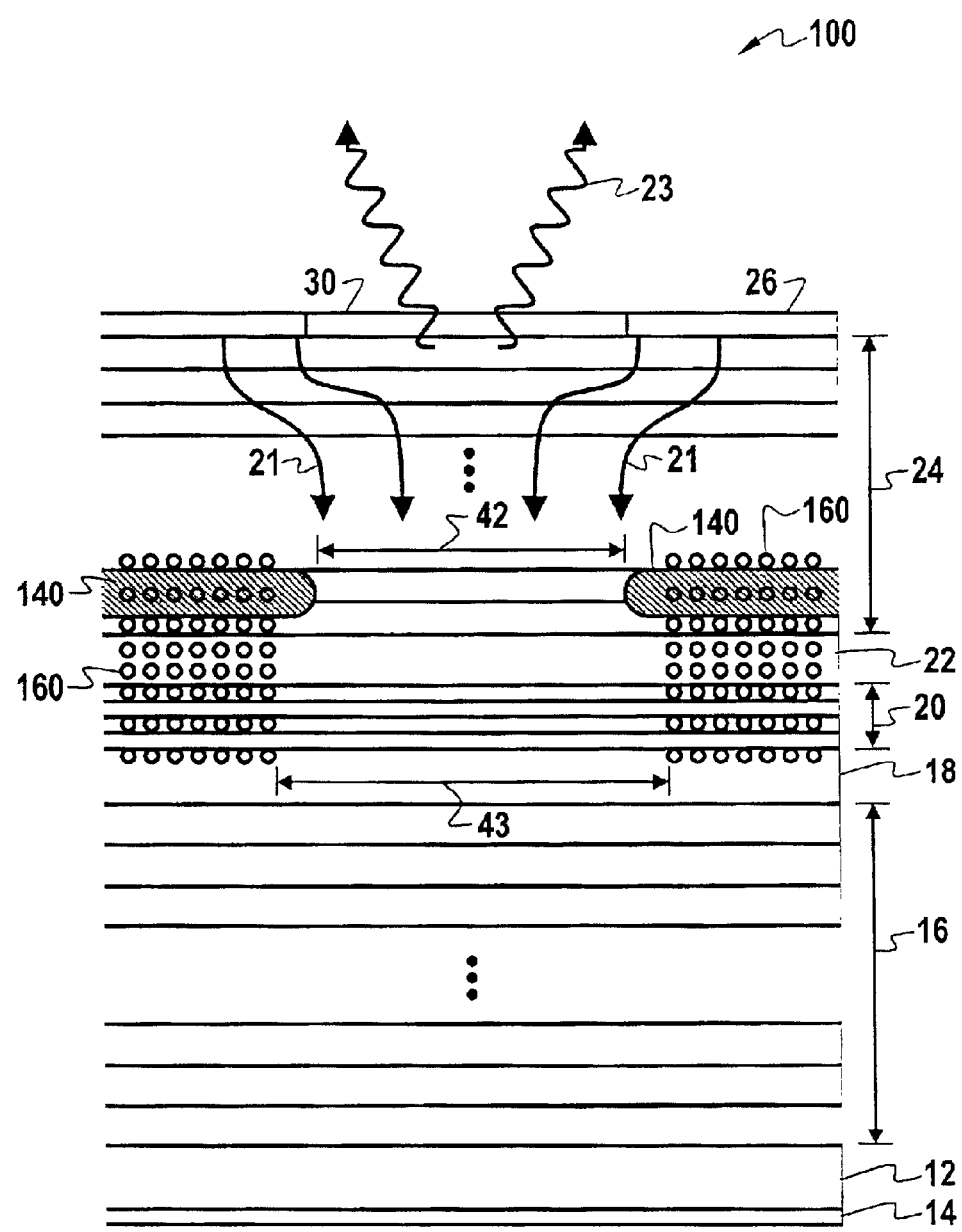
FIG. 2 illustrates a vertical cavity surface emitting laser according to the principles of the present invention.

The principles of the present invention provide for VCSELs that use a current confinement structure comprised of both an oxide layer and an ion implanted gain guide. An example of such a VCSEL is the VCSEL 100 illustrated in FIG. 2. FIG. 2 should be understood as a "cut-away" schematic depiction of a section of a VCSEL that is generally configured as shown in FIG. 1. Thus, the same element numbers will be used for similar elements in FIG. 2 that were used in FIG. 1.

As shown in FIG. 2, the VCSEL 100 includes an n-doped gallium arsenide (GaAS) substrate 12 having an n-type electrical contact 14. An n-doped lower mirror stack 16 (a DBR) is on the GaAS substrate 12, and an n-type lower spacer 18 is disposed over the lower mirror stack 16.

An active region 20 having P-N junction structures with a number of quantum wells is formed over the lower spacer 18. The composition of the active region 20 is beneficially AlGaAs, with the specific aluminum varying in different layers that form the active region 20. For example, one layer may have between twenty and thirty percent of aluminum, while an adjacent layer might have between zero and five percent of aluminum. There could be more or fewer alternating layers, depending how the quantum wells are to be located within the active region 20. On the active region 20 is a p-type top spacer 22. A p-type top mirror stack 24 (another DBR) is disposed over the top spacer 22. Over the top mirror stack 24 is a p-type conduction layer 9, a p-type GaAs cap layer 8, and a p-type electrical contact 26. As in the VCSEL 10 (see FIG. 1), the lower spacer 18, the active layer 20, and the top spacer 22 separate the lower mirror stack 16 from the top mirror stack 24 such that an optical cavity that is resonant at a specific wavelength is formed.

Still referring to FIG. 2, a portion of the top mirror stack 24, and possibly a thin region of the top spacer 22, includes an oxide-insulating region 140. That oxide layer is produced by forming a portion of the top mirror stack 24 from an AlGaAs layer(s) having a high aluminum content (greater than 95%, and beneficially in the range of 97–98%), and then oxidizing that high aluminum content layer to form an annular oxide ring. Oxidation produces the oxide-insulating region 140. Furthermore, a spatial region, which includes part of the oxide-insulating region 140, is implanted with ions 160. The damage from these ions beneficially extends into the active layer 20. A central opening 42 is the aperture in insulating region 140. A central opening 43 in the gain-guide implant region 160 is not implanted with ions (the spatial region of the implant does not extend completely across the central opening 42). The aperture 42 in the insulating region 140 may be either larger or smaller in diameter than the damage free region of gain-guide implant aperture 43.

In operation, an external bias causes an electrical current 21 to flow from the p-type electrical contact 26 toward the n-type electrical contact 14. The insulating region 140 and its conductive central opening 42 guide the current 21 through the conductive central openings 42 and 43 such that the current 21 flows into the active region 20. Some of the electrons in the current 21 are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 2, the light 23 passes through the p-type conduction layer 9, through the p-type GaAs cap layer 8, through an aperture 30 in the p-type electrical contact 26, and out of the surface of the vertical cavity surface emitting laser 100.

The oxide-insulating region 140 is beneficially introduced at the proper location and thickness to achieve the best optical results, while the energy and dose of the implanted ions that form the damaged region 160 can be tailored to independently control the lateral sheet resistance and non-radiative centers within the active region. Proper VCSEL design enables achievement of a low order optical mode structure with low threshold, high speed, and high efficiency.

Prior art descriptions of VCSELs formed with both oxide and gain guide apertures differ fundamentally from the current invention. For example, "5.2 mW Single-Mode Power from a Coupled Resonator Vertical-Cavity Laser," by A. J. Fischer, et al., LEOS 2000 Proceedings pp.802–803, and "High-Power Single Mode Operation of Hybrid Ion-Implanted/Selectively-Oxidized VCSELs," by G. Ronald Hadley, et al., pp. 804–805 describe VCSELs with both oxide and gain guide implant apertures, but the implant aperture is intentionally positioned entirely above the oxide aperture, and performs a different function, with no effect on either the lateral resistance under the oxide aperture or on recombination centers in the PN-junction region.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

The embodiments of an invention in which an exclusive property or right is claimed are defined as follows:

1. A vertical cavity surface emitting laser, comprising:
   a substrate;
   an active region adjacent said substrate;
   a first mirror between said active region and said substrate; and
   a second mirror adjacent said active region, said active region being between said second mirror and said first mirror;
   wherein said second mirror includes an oxide insulating region; and
   wherein said oxide insulating region, said active region, and at least a portion of said second mirror include damage from implanted ions.

2. The vertical cavity surface emitting laser of claim 1, wherein said oxide insulating region and said damage from said implanted ions define a high resistance region that substantially confines current flow through an inner portion of said high resistance region.

3. The vertical cavity surface emitting laser of claim 2, wherein said high resistance region is shaped as an annular ring.

4. The vertical cavity surface emitting laser of claim 1, further including a spacer between said active region and said second mirror, wherein said spacer includes damage from said implanted ions.

5. A vertical cavity surface emitting laser, comprising:
   a substrate;
   a first mirror on said substrate;
   a first spacer on said first mirror;
   an active region on said first spacer;
   a second spacer on said active region;
   a second mirror on said second spacer;
   wherein said second mirror includes an oxide insulating region; and
   wherein said oxide insulating region, said second spacer, said active region, and at least a portion of said second mirror includes damage from implanted ions.

6. The vertical cavity surface emitting laser of claim 5, wherein said second mirror is comprised of aluminum-containing III-V compound semiconductors, and wherein said oxide insulating region includes an aluminum oxide.

7. The vertical cavity surface emitting laser of claim 6, wherein said second mirror includes an aluminum-containing layer whose group III composition is more than 95% aluminum.

8. The vertical cavity surface emitting laser of claim 7, wherein said aluminum-containing layer is oxidized.

9. The vertical cavity surface emitting laser of claim 5, wherein said oxide insulating region extends into said second spacer.

10. The vertical cavity surface emitting laser of claim 9, wherein said oxide insulating region is shaped as an annular ring.

11. The vertical cavity surface emitting laser of claim 5, wherein said substrate is n-type.

12. The vertical cavity surface emitting laser of claim 5, further including a p-type conduction layer over said second mirror, a p-type cap layer over said p-type conduction layer, and a p-type electrical contact over said p-type cap layer, wherein said p-type electrical contact includes an opening for light emission.

13. The vertical cavity surface emitting laser of claim 5, further including an n-type conduction layer over said second mirror, an n-type cap layer over said n-type conduction layer, and an n-type electrical contact over said n-type cap layer, wherein said n-type electrical contact includes an opening for light emission.

14. A method of forming a vertical cavity surface emitting laser, comprising:

forming a first electrical contact on a substrate;

forming a first mirror structure on the substrate;

forming a first spacer on the first mirror structure;

forming an active region on the first spacer;

forming a second spacer on the active region;

forming a second mirror on the second spacer, wherein the second mirror includes a high aluminum content layer;

forming a conduction layer over the second mirror;

forming a cap layer over the conduction layer;

forming a second electrical contact on the cap layer;

oxidizing the high aluminum content layer to form an oxide layer; and damaging the oxide layer, the second spacer, and at least part of the active region by implanting ion to form a current confining region.

15. The method of forming a vertical cavity surface emitting laser according to claim 14, wherein forming the active region includes forming a quantum well.

16. The method of forming a vertical cavity surface emitting laser according to claim 14, wherein the oxide layer is formed with an annular shape.

17. The method of forming a vertical cavity surface emitting laser according to claim 14, wherein implanting ions produces non-radiative recombination centers in the active region.

18. The method of forming a vertical cavity surface emitting laser according to claim 14, wherein forming the second electrical contact includes forming an opening for light emission.

19. The method of forming a vertical cavity surface emitting laser according to claim 14, wherein forming the first electrical contact on the substrate includes forming an n-doped substrate.

20. The method of forming a vertical cavity surface emitting laser according to claim 14, wherein forming the second mirror on the second spacer includes forming a p-doped second mirror.

21. The method of forming a vertical cavity surface emitting laser according to claim 14, wherein the first spacer is a lower spacer.

22. The method of forming a vertical cavity surface emitting laser according to claim 14, wherein the second spacer is a top spacer.

23. The method of forming a vertical cavity surface emitting laser according to claim 14, wherein the high aluminum content is more than about 95% aluminum.

24. The method of forming a vertical cavity surface emitting laser according to claim 14, wherein the high aluminum content is in a range of 97–98% aluminum.

25. The method of forming a vertical cavity surface emitting laser according to claim 14, wherein the current confining region has high resistance.

* * * * *

UNITED STATES PATENT AND TRADEMARK OFFICE
CERTIFICATE OF CORRECTION

| | |
|---|---|
| PATENT NO. | : 6,816,526 B2 |
| APPLICATION NO. | : 10/028436 |
| DATED | : November 9, 2004 |
| INVENTOR(S) | : James R. Biard and James K. Guenter |

It is certified that error appears in the above-identified patent and that said Letters Patent is hereby corrected as shown below:

Column 1
Line 33, change "(GaAS)" to --(GaAs)--
Line 35, change "GaAS" to --GaAs--

Column 3
Line 22, change "then" to --than--

Column 4
Line 65, change "(GaAS)" to --(GaAs)--
Line 66, change "GaAS" to --GaAs--

Column 8
Line 4, change "ion" to --ions--

Signed and Sealed this

Nineteenth Day of September, 2006

JON W. DUDAS
*Director of the United States Patent and Trademark Office*